United States Patent [19]

Knauer

[11] 4,188,597
[45] Feb. 12, 1980

[54] PROCESS FOR THE OPERATION OF A TRANSVERSAL FILTER

[75] Inventor: Karl Knauer, Gauting, Fed. Rep. of Germany

[73] Assignee: Siemens Aktiengesellschaft, Berlin & Munich, Fed. Rep. of Germany

[21] Appl. No.: 832,234

[22] Filed: Sep. 12, 1977

[30] Foreign Application Priority Data

Sep. 30, 1976 [DE] Fed. Rep. of Germany ....... 2644284

[51] Int. Cl.² ................ H03H 7/28; G11C 27/00; H01L 29/78
[52] U.S. Cl. .................... 333/165; 307/221 D; 333/166; 357/24
[58] Field of Search ............. 333/29, 70 T, 70 R, 333/165, 166, 173; 307/221 D, 193, 194; 357/24; 328/167; 364/724, 725, 726, 862

[56] References Cited

U.S. PATENT DOCUMENTS

| 3,914,748 | 10/1975 | Barton et al. ............. | 357/24 X |
| 3,999,082 | 12/1976 | Early ........................ | 357/24 X |
| 4,064,533 | 12/1977 | Lampe et al. ............. | 357/24 X |
| 4,080,581 | 3/1978 | Sakue et al. .............. | 307/221 D X |

OTHER PUBLICATIONS

Buss et al.–"Transversal Filtering using Charge Transfer Devices" in IEEE Journal of Solid-State Circuits, vol. SC8, No. 2, Apr. 1973; pp. 138-146.

Puckette et al. –"Bucket-Brigade Transversal Filters" in IEEE Transactions on Circuits and Systems, vol. CAS-21, No. 4, Jul. 1974; pp. 502-510.

*Primary Examiner*—Alfred E. Smith
*Assistant Examiner*—Marvin Nussbaum
*Attorney, Agent, or Firm*—Hill, Van Santen, Steadman, Chiara & Simpson

[57] ABSTRACT

In an illustrated embodiment, at least one analog shift register has a number of parallel inputs and one series output. A number of individual evaluating circuits receive the signal to be filtered and supply respective output quantities of charge equal to the product of the difference between the relevant signal value and a predetermined minimum or maximum value, and a respective individual evaluation factor. The output of each evaluating circuit can be connected via a switching element to an associated parallel input. According to the present teaching, a considerably lesser space requirement is realized by operating the filter so that for every consecutive scanned value of the signal each evaluating circuit is read in twice consecutively with a charge shift between such read-in processes, no charge shift being effected between the second read-in process and the first read-in process for the next scanned signal value. Read-in of the held signal may be effected more than twice.

4 Claims, 4 Drawing Figures

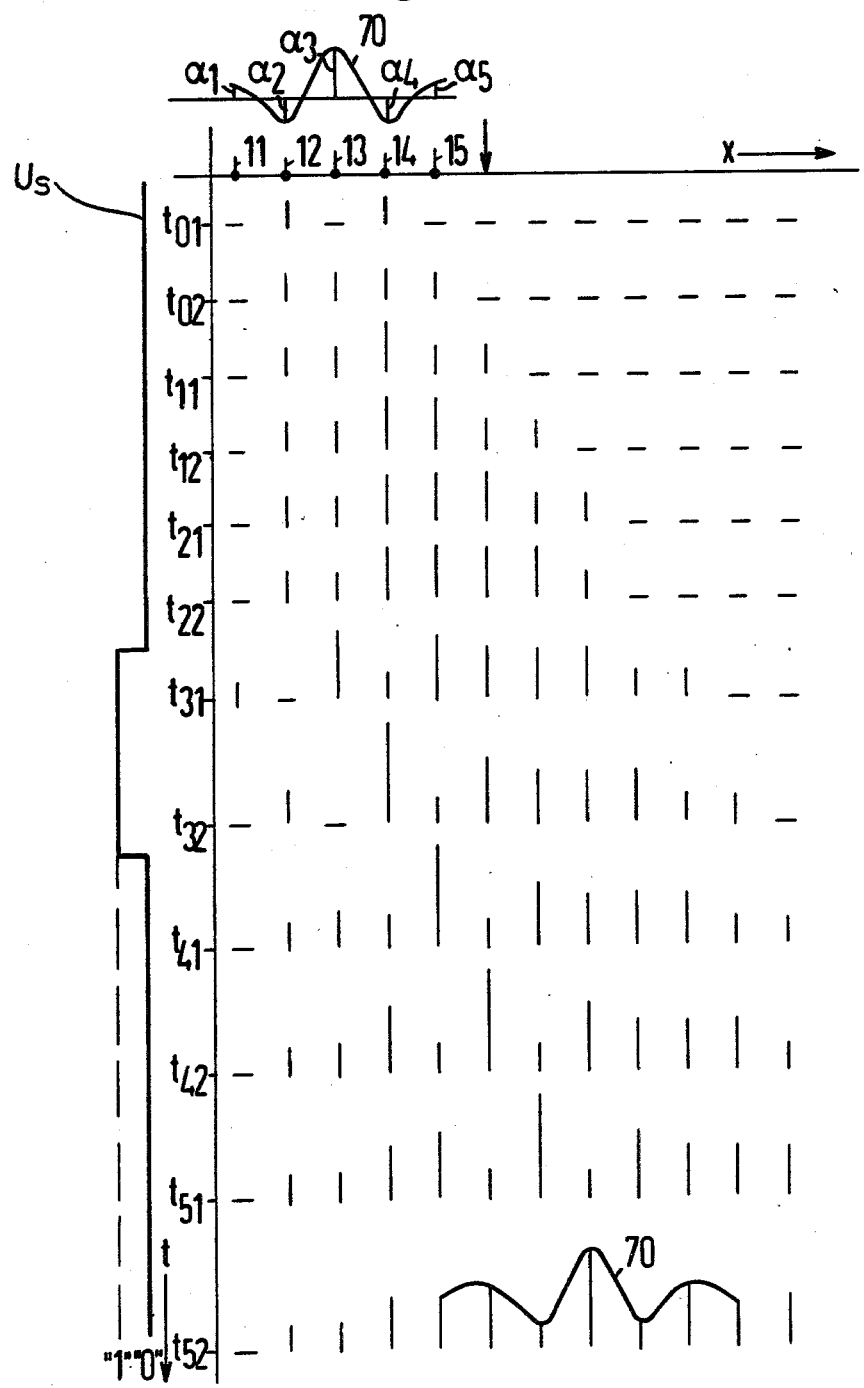

PROCESS FOR THE OPERATION OF A TRANSVERSAL FILTER

CROSS-REFERENCE TO RELATED APPLICATION

The present application is an improvement over a joint application of the present inventor and Messrs. Schlichte and Pfleiderer, U.S. Ser. No. 832,232 filed Sept. 12, 1977.

BACKGROUND OF THE INVENTION

The present invention relates to a process for the operation of a transversal filter, wherein the latter is provided with at least one analog shift register which possesses a number of parallel inputs and one series output, wherein a further number of individual, predeterminable evaluating circuits is provided, wherein each evaluating circuit possesses a signal input for the input of the signal which is to be filtered and an output, where the output of each evaluating circuit can be connected via a switching element to an associated parallel input, wherein the analog shift register is operated in known manner, wherein the input of every evaluating circuit is always connected with the input signal either directly or with a time delay, wherein an evaluating circuit is in each case read into the shift register as a result of the closure of its switching element at least whenever a quantity of charge is shifted from the directly adjacent storage position having a parallel input, to which at least one evaluating circuit is connected, into the associated storage position having a parallel input, and wherein the filtered signal is withdrawn from the series output.

SUMMARY OF THE INVENTION

The aim of the present invention consists in improving upon the operating process described in the introduction.

The aim is realized in that for every consecutive scanned value of the signal which is to be filtered, each evaluating circuit is read in twice consecutively, where a charge shift is carried out in each case between two such read-in processes, and wherein no charge shift is effected between the second read-in process and the first read-in process for the next scanned value. It is possible to effect read-in of the held signal value more than twice. At not too high frequencies of the signal to be filtered, it is superfluous to render the signal discrete since the signal changes within the time between the first and the last read-in process when the signal value is held are of no significance.

A fundamental advantage of this process in comparison to that of the type described in the introduction consists in that a transversal filter of the type described in the introduction having a considerably lesser space requirement can be used to realize a given filter function.

INCORPORATION BY REFERENCE

The above identified U.S. application of Messrs. Karl Knauer, Max Schlichte, and Hans-Jörg Pfleiderer is incorporated herein by reference in its entirety by way of background to the present invention, except for FIGS. 1-3 and the description thereof which are physically present herein.

BRIEF DESCRIPTION OF THE DRAWINGS

Other objects, features and advantages of the present invention will be apparent from the incorporated application for patent when taken with the following detailed description and illustrative fourth figure of drawings, the accompanying drawings being briefly described as follows:

FIG. 4 illustrates how the filtered signal is formed in a device as shown in FIG. 2 when operated in accordance with the teachings and concepts of the present invention.

DETAILED DESCRIPTION OF THE PREFERRED EMBODIMENT

Figure 1:
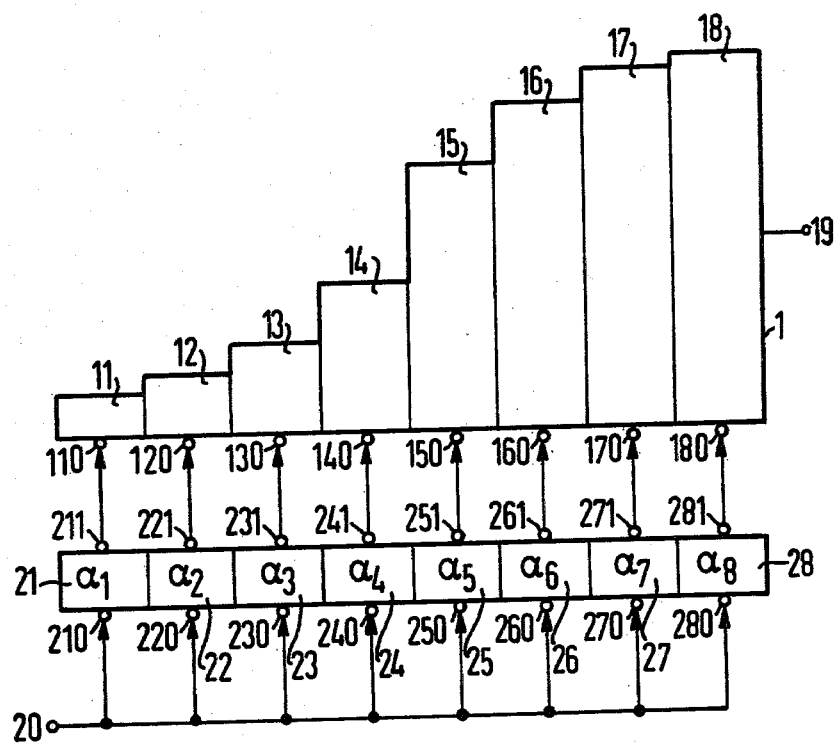
FIG. 1 shows the fundamental construction of a simple embodiment of transversal filter in accordance with the invention of the incorporated patent application.

The description will be based on a transversal filter of the simplest type. This type of transversal filter consists of only one analog shift register which, in every storage position, has a parallel input, and has a series output. Every parallel input is connected to an evaluating circuit. The inputs of all the evaluating circuits are connected to a common signal input. The signal which is to be filtered is connected to this common signal input. The above described process now proceeds in such manner that all the evaluating circuits are read into the analog shift register in parallel. At the instant of this read-in process, a specific signal value is present at the common signal input. This signal value is now held, and the read-in information is in each case shifted by one storage position towards the series output. Directly following the shift process, the evaluating circuits are again read in parallel into the analog shift register, the held signal value still being present at the common signal input.

It is again possible to proceed in the above manner, but for simplicity it will be assumed that read-in effected only twice for the held signal value. Following the second read-in process, the signal value is thus no longer held and now the signal value actually occurring at this instant is present at the common signal input. This signal value is again held and the evaluating circuits are read into the analog shift register in parallel form. In this case, however, no shift occurs between the read-in of the evaluating circuits with the previous signal value and the read-in with the current signal value. Following the read-in with the current, held signal value, a shift occurs by one storage position towards the series output, whereupon read-in is again carried out and the process is continued successively.

For the process it is expedient if the signal which is to be filtered is rendered discrete. At not too high frequencies of the signal to be filtered, this is superfluous however, as signal changes within the time between the first and last read-in process when the signal value is held are of no significance.

It should be pointed out that the process is not restricted to the above described simple case of a transversal filter corresponding to the aforesaid incorporated patent application, but can be used for all further developments and modifications disclosed therein.

The described process now allows a decisive advance to be achieved in respect of the space requirement of a transversal filter in accordance with the main patent. The above described simple transversal filter will again serve by way of further explanation. In order to achieve a predetermined filter function which, as pulse response, is given by consecutive coefficients $\alpha_n$ to $\alpha_1$, it is known to proceed in such manner that every evaluating circuit is assigned such a coefficient as individual factor, where the assignment is carried out consecutively in the shift direction and in the direction of increasing indices. As is known, the individual factors are realized by capacitances which, in the case of high coefficients, necessitate a considerable space requirement.

Employing the described process, the predetermined filter function can now be realized in such manner that the evaluating circuits having the individual evaluation factors $\alpha_1$ to $\alpha_n$ are individually replaced by new evaluating circuits having the new individual evaluation factors $\alpha_1-\alpha_2$, $\alpha_2-\alpha_3$, ..., $\alpha_{n-2}-\alpha_{n-1}$, $\alpha_{n-1}-\alpha_n$, $\alpha_n$. Thus when the described process is employed, generally speaking lower individual evaluation factors are obtained. As in the aforesaid incorporated patent application, for negatives of the new evaluation factors, the evaluating circuit must supply a quantity of charge which, apart from the individual factor, is equal to the difference between the maximum value minus the relevant signal value.

Here again it should be noted that the latter process is not restricted to the above described, simple transversal filter, but can be used for all further developments and modifications thereof.

DESCRIPTION OF FIGS. 1–3 FROM THE INCORPORATED PATENT APPLICATION

In FIG. 1, the analogue shift register is referenced 1. The individual storage positions of this shift register are referenced 11 to 18, the parallel inputs are referenced 110 to 180, and the output of the shift register is referenced 19. The evaluating circuits are provided with the references 21 to 28. Each evaluating circuit possesses an input for the input of the signal which is to be filtered, and possesses an output. These inputs are provided with the references 210 to 280, and these outputs are provided with the references 211 to 281. The individual factors of the evaluating circuits are symbolized by $\alpha_1$ to $\alpha_8$ and are entered into the evaluating circuits. The output of every evaluating circuit is connected via a switching element, which for the sake of simplicity has not been shown here, to an associated parallel input of the shift register. The signal inputs are connected to a common signal input 20. The capacity of every storage position of the shift register must be at least such that it is always able to accommodate the maximum quantity of charge supplied by the adjacent storage position (adjacent in the direction opposite to that of the shift process), and when the storage position is one having a parallel input, can additionally accommodate the maximum quantities of charge supplied by the assigned evaluating circuit (s). In FIG. 1, every storage position possesses one parallel input and every parallel input is assigned only one evaluating circuit.

In FIG. 1, the requisite capacity of every storage position is symbolized by the size of its area. Generally, the requisite capacity of a storage position consists of the sum of all the individual factors of those evaluating circuits which are connected to storage positions by which it is preceded and accompanied times the difference quantity of the maximum value minus the minimum value. If the shift register is operated with a fundamental charge, the capacity of every storage position must be extended by this fundamental charge.

In the operation of the transversal filter illustrated in FIG. 1, the shift register is operated in the conventional manner and the signal which is to be filtered is connected to the common signal input 20. As a result of the simultaneous opening of the switching elements, the quantities of charge which are supplied by the evaluating circuits and which correspond to the instantaneous signal value, are read into the shift register in parallel fashion. Following the displacement of these quantities of charge by one storage position towards the series output, the read-in process is recommenced etc.

If the signal which is to be filtered is a pulse of short duration whose duration is shorter than the time required for the shift process from one storage position to the next, at the series output 19 a pulse sequence is obtained in which when there are as many adjacent pulses as parallel inputs are provided, the pulse amplitudes differ from an equal value. In a time sequence, the quantity of the deviation corresponds to the individual factors $\alpha_8$ to $\alpha_1$, i.e. the first pulse in the time sequence having a deviating amplitude differs by $\alpha_8$, the next by $\alpha_7$ etc. from the equal value. The decision whether this quantity is added or deducted from the equal value is dependent upon the nature of the associated evaluating circuit. If the associated evaluating circuit supplied a quantity of charge which, apart from the individual evaluation factor, is equal to the difference between the relevant signal value of the signal to be filtered minus the minimum value, the quantity is added, and otherwise it is deducted. Accordingly, using a transversal filter as illustrated in FIG. 1, a predetermined pulse response can be realized in a very simple fashion as follows: the pulse response is represented as a series of time coefficients. Each coefficient indicates the amplitude of the pulse response at a specific support point. The coefficients are assigned an equal number of adjacent storage positions having a parallel input in the shift register. Each parallel input is assigned an evaluating circuit, in each of which one of the coefficients is selected as the individual evaluation factor. The evaluating circuits are assigned consecutively to the parallel inputs in accordance with the time sequence of the coefficients, in the direction opposite to that of the shift process. In the case of positive coefficients, evaluating circuits are employed which at their output supply a quantity of charge which, apart from the coefficients, is equal to the difference in the relevant signal value of the signal to be filtered minus the minimum value, and in the case of negative coefficient the other type of evaluating circuit is used.

Figure 2:
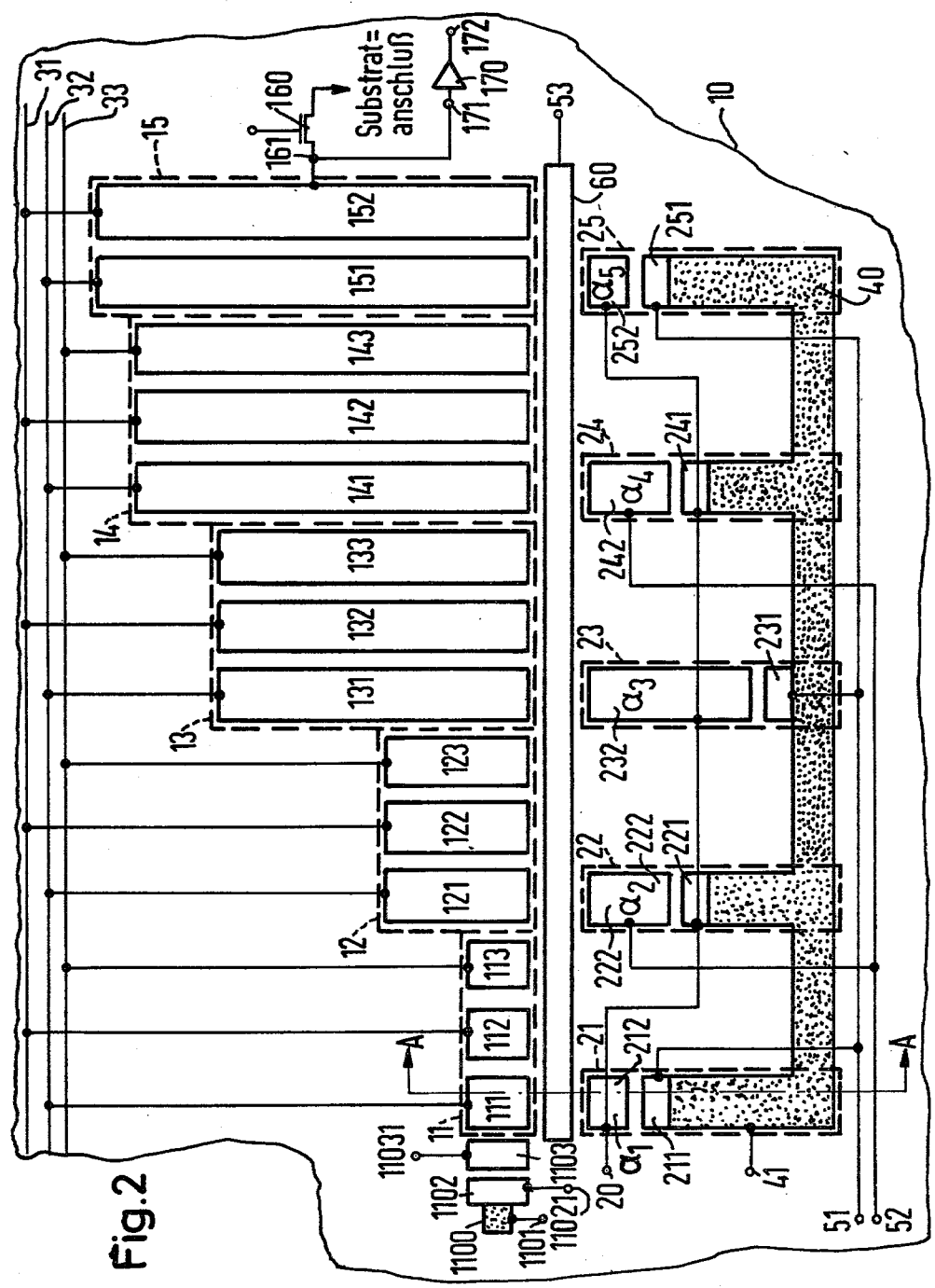
FIG. 2 shows a realization of a transversal filter as shown in FIG. 1 in which the shift register is designed as a charge coupled device for three-phase operation, and the evaluating circuits comprise pairs of capacitors.

FIG. 2 illustrates a realization of a transversal filter corresponding to FIG. 1. Here, in contrast to FIG. 1, only the first five storage positions having a parallel input and the first five evaluating circuits are provided. All the references in this part of FIG. 1 are used for the corresponding devices in FIG. 2. In FIG. 2, on a surface of a substrate 10 composed of doped semiconductor material of one conductivity type, the shift register is constructed as a CCD for three-phase operation and the evaluating circuits are constructed as pairs of capacitors. The CCD consists of a series of insulating layer—or blocking layer—capacitors 111 to 152, which are arranged on the surface of the substrate. The distance between the outer electrodes of adjacent capacitors must be selected to be sufficiently small (<3 μm) that a charge transfer can take place. Each of the storage positions 11 to 14 consists of three of these capacitors arranged next to one another. The storage position 15 here consists of only two capacitors. Beside the capacitor 111 there is arranged a conventional input stage, and beside the capacitor 152 there is arranged a conventional output stage which comprises a field effect transistor 160 as reset transistor and of an amplifier 170, whose input 171 is connected to the source electrode 161 of the transistor 160 and at whose output 172 the filtered signal can be obtained. The input stage serves merely for the input of fundamental charge into the CCD. It consists of a zone 1100 which is doped oppositely to the substrate and which is provided with a terminal contact 1101, and of two insulating layer—or blocking layer—capacitors 1102 and 1103 which are arranged next to one another, where the insulating layer—or blocking layer—capacitor 1102 is arranged directly next to the doped zone 1100 and the other is arranged directly next to the capacitor 111. The gate electrode of each of these capacitors is provided with a terminal contact 11021 and 11031. The operation is carried out in accordance with the fill and spill method, i.e. two different voltages are connected to the gate electrodes of the capacitors 1102 and 1103, so that beneath the gate electrode of the capacitor 1103 there exists a potential well of the surface potential in comparison to that of the other. By briefly connecting a suitable voltage to the doped zone above its terminal contact, both capacitors are overflooded with charge carriers (in the present case with electrons). Accordingly a blocking voltage is connected to the doped zone, as a result of which all the charge carriers except for those in the potential well beneath the gate electrode of the capacitor 1103, flow back into the doped zone. The determinate quantity of charge held in the potential well is input, as fundamental charge, into the CCD when the maximum pulse train voltage difference exists across the capacitor 111. The outer capacitor electrodes of all the capacitors 111 to 152 are connected to three pulse train lines 31 to 33 in accordance with the three-phase operation. The capacitors arranged at the same point in every storage position are connected to the same pulse train line.

The evaluating circuits 21 to 25 are arranged beside (adjacent) capacitors which are connected to the same pulse train line—in the present case the pulse train line 32. Each evaluating circuit consists of a pair of capacitors which is arranged on the surface of the substrate and is composed of a first insulating layer—or blocking layer—capacitor 211 to 251, which has a contact in the form of a zone 40 which zone 40 is arranged on the surface of the substrate, is provided with a terminal contact 41, and is doped oppositely to the substrate (this is to signify that the lateral spacing of the outer capacitor electrode is <3 μm), and is composed of a second insulating layer—or blocking layer—capacitor 212 to 252 which is arranged closely (<3 μm) beside the first. The second insulating layer—or blocking layer—capacitor in each case possesses a capacitance which is equal to the individual factor. In FIG. 2 the individual factor is symbolized by the area content of the second capacitors 212 to 252. The following special selection has been made: $\alpha_2 = 2\alpha_1$, $\alpha_3 = 2\alpha_2$, $\alpha_4 = \frac{1}{2}\alpha_3$ and $\alpha_5 = \frac{1}{2}\alpha_4$. Accordingly in the CCD, the requisite capacity of each capacitor is symbolized by its area content. The evaluating circuits 21, 23 and 25 are especially for positive coeffecients, and the evaluating circuits 22 and 24 are especially for negative coefficients. Accordingly the outer capacitor electrodes of the capacitors 212, 221, 232, 241 and 252 are connected to the common signal input 20, the outer electrodes of the capacitors 211, 231 and 251 are connected to a terminal 51 to which a fixed voltage is connected, whose value is equal to the minimum value of the signal to the filtered, and the outer electrodes of the capacitors 222 and 242 are connected to a second terminal 52 for the connection of a second fixed voltage whose value is equal to the maximum value of the signal to be filtered. The output of each evaluating circuit is located in the second insulating layer—or blocking layer—capacitors. The counter electrode, i.e. the zone beneath the outer capacitor electrode of these second capacitors is connected via a CCD to the counter electrode of the associated capacitor of the CCD. All the charge transfer elements consist of a gate electrode 60 which is common to all the evaluating circuits and which is connected to a third terminal 53, and which is separated from the substrate surface by an electrically insulating layer. The lateral distance of the gate electrode to the corresponding capacitors of the CCD and the evaluating circuit must be sufficiently narrow (<3 μm). In order to prevent a charge flow beneath the gate electrode in its longitudinal direction, it is expedient to arrange said gate electrode between the evaluating circuits on a thicker insulating layer. The charge transfer elements can also consist of field effect transistors.

Figure 3:
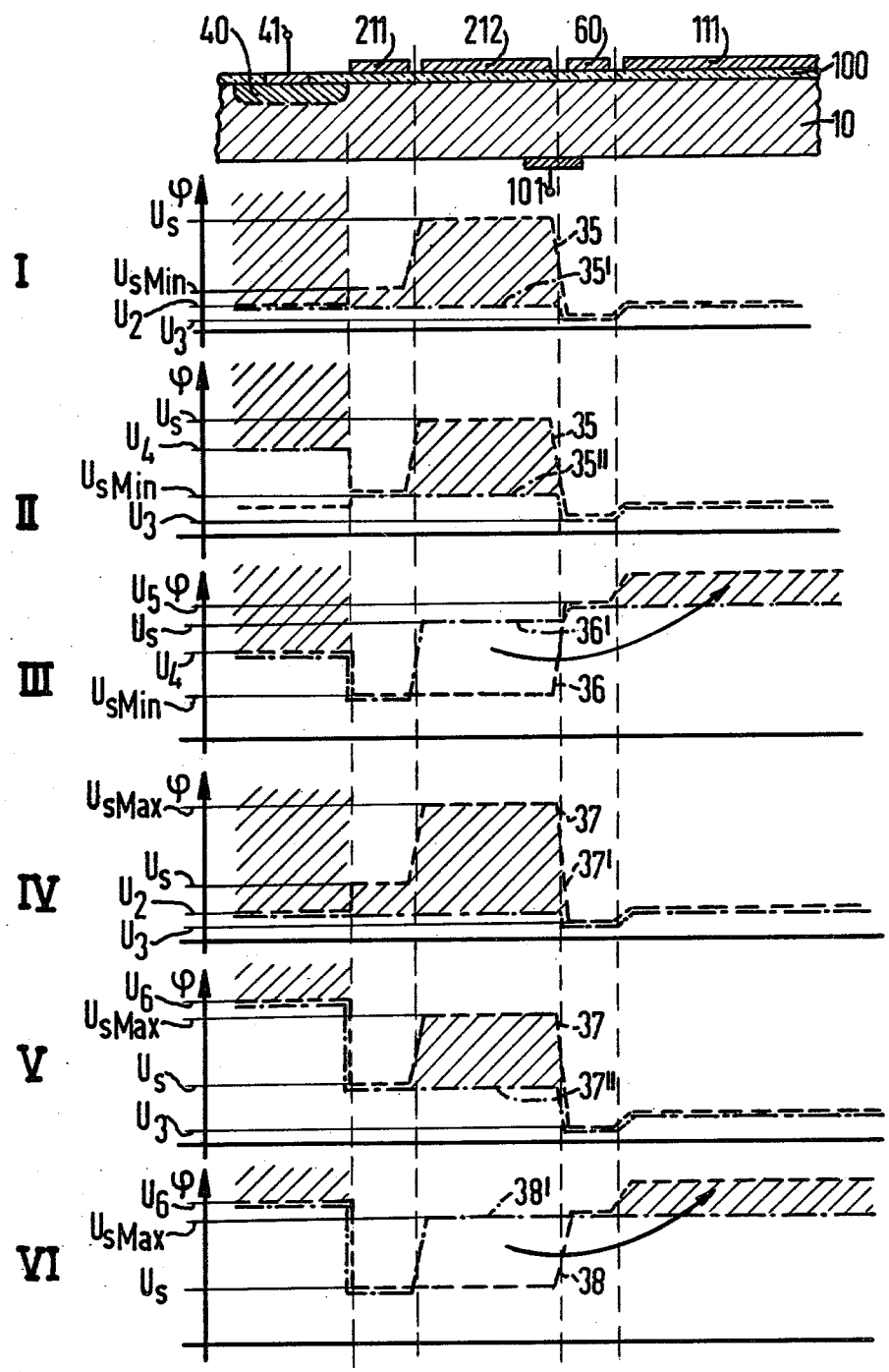
FIG. 3 is a cross section through the realization shown in FIG. 2 along the sectional line A—A, and beneath in diagrams I to VI, shows local potential curves of the surface potential in the substrate for various modes of operation and operating states.

Making reference to FIG. 3, the mode of operation of an evaluating circuit as shown in FIG. 2, which is likewise carried out in accordance with the fill and spill method, will be explained in detail. Here FIG. 3 is a cross-section through the transversal filter shown in FIG. 2, along the sectional line A—A. Beneath this cross-section, diagrams I to VI illustrate local potential curves of the surface potential $\psi$ in the substrate for various modes of operation and operating states. The cross-section illustrates the substrate 10, for example p-doped silicon, with the substrate terminal 101. On the surface of the substrate is arranged an electrically insulating layer 100, consisting for example of silicon dioxide, on which are arranged the outer electrodes of the insulating layer capacitors 111, 212 and 211 and the gate electrode 60. The outer electrodes of the capacitors are provided with the same references as in FIG. 2. Beside (adjacent) the electrode 211, directly beneath the substrate surface is arranged the oppositely doped zone 40. The switching element 21 (capacitor 212) which is shown in cross-section is assigned a positive coefficient ($\alpha_1 < 0$). The relevant mode of operation will be explained in detail making reference to diagrams I to III. The electrode 211 is always connected with the minimum value $U_{MIN}$, whereas the electrode 212 is always connected to the instantaneous signal value. When a quantity of charge has been input into the CCD, it is cut off by the connection of a voltage $U_3$ which is smaller than $U_{MIN}$. Then the terminal 41 is connected to a voltage $U_2$ which lies between $U_{MIN}$ and $U_3$. As a result the surface zones of the substrate beneath the electrodes 211 and 212 become overflooded with electrons. Diagram I schematically illustrates these conditions. The broken-line curve 35 shows the local course of the surface potential in the substrate prior to the overflooding, and the dash-dotted curve 35' shows that following the overflooding, in schematic form. The shaded zone indicates the area which is overflooded with electrons. $U_S$ indicates the instantaneous signal value. In actual fact, in first approximation the start voltage by which the surface potential is reduced would have to be deducted from $U_{MIN}$, $U_S$ and $U_3$, but here and in the following this has been omitted for the sake of simplicity. Following the overflooding, at the terminal 41 the voltage is increased beyond $U_{MIN}$ to a value $U_4$. Diagram II represents the conditions (curve 35") for this situation. As can be seen, apart from the zone 40 electrons are stored only beneath the electrode 212. The stored quantity of charge is equal to the product of the capacitance of this insulating layer capacitor times the difference $U_S - U_{MIN}$. Subsequently the voltage across the gate electrode is increased beyond $U_S$ to $U_5$, which is advantageously selected to be greater than the signal maximum. If the maximum pulse train voltage which is selected to be greater than or equal to $U_5$ now appears across the capacitor electrode of the capacitor 111, the quantity of charge stored beneath the electrode 212 is read out and the process recommences. Diagram III represents the associated potential conditions by the curves 36 and 36', where the broken-line curve 36 represents the conditions at the beginning of the read-out process, and the dash-dotted curve 36' represents the conditions at the end of the read-out process.

It will now be assumed that the evaluating circuit 21 is assigned a negative coefficient, as is actually the case in the evaluating circuits 22 and 24. In this situation the signal $U_S$ is constantly connected to the electrode 211, and the maximum value $U_{MAX}$ is constantly connected to the electrode 212. As previously, following the read-in of the quantity of charge into the CCD, the switching element is opened in that the gate electrode is connected to a voltage which is smaller than the signal value $U_S$. Expediently this is again the voltage $U_3$. Then the input 41 is connected to a voltage which is smaller than $U_S$. Expediently it is also selected to be equal to the voltage $U_2$. As in the preceding case, the zones beneath the electrodes 211 and 212 are overflooded with electrons. Diagram IV represents these conditions. The broken-line curve 37 indicates the curve of the surface potential in the substrate prior to the overflooding, the dash-dotted curve 37' indicates that following the overflooding, and the shaded zone is the component overflooded with electrons. Then the voltage across the terminal 41 is increased beyond the signal value $U_S$, and expediently even beyond $U_{MAX}$, so that a voltage $U_6$ is connected thereto. Beneath the electrode 212 there is now stored a quantity of charge which is equal to the capacitance of the capacitor 212 times the difference $U_{MAX} - U_S$. Diagram V illustrates these conditions (curve 37"). Then the voltage across the gate electrode is increased to $U_{MAX}$ or above, and the electrons stored beneath the electrode 212 can discharge into the capacitor 111 when the maximum pulse train voltage is connected thereto. The broken-line curve 38 and the dash-dotted curve 38' in the diagram VI represents the course of the surface potential prior to and following the end of the read-out process respectively.

The above described operating process has been based on a p-doped substrate. i.e. all the voltages are positive relative to the substrate potential. In the case of a n-doped substrate it is merely necessary to reverse the polarity of all the voltages, in which case the value $U_{MAX}$ will now correspond to the maximum negative value, and $U_{MIN}$ will now correspond to the smallest negative value.

Relative to the substrate potential, only positive signal values will now expediently be used in the case of a p-doped substrate, and only negative signal values in the case of a n-doped substrate.

FIG. 4 illustrates how the filtered signal for an impulse is formed as input signal. At the time points $T_{i1}$ (i; 0, 1, 2, 3, 4, 5), the respective signal values are read in, and at each time point $T_{i2}$, the signal value of $T_{i1}$ is read after a previous displacement. The rule, in accordance with which the signal is formed, is otherwise the same as in the aforesaid incorporated application.

It will be apparent that many modifications and variations may be effected without departing from the scope of the novel concepts and teachings of the present invention.

I claim as my invention:

1. A process for the operation of a transversal filter, wherein the latter is provided with at least one analogue shift register which possesses a plurality of storage positions having parallel inputs and further possesses a series output, wherein a number of individual, predeterminable evaluating circuits is provided, where each evaluating circuit possesses a signal input for the input of the signal to be filtered and an output for providing an output signal weighted according to an evaluation factor, where the output of every evaluating circuit can be connected via a switching element to an associated one of said parallel inputs, wherein the analogue shift register is operated in known manner to effect a charge shift process where charge is shifted toward the series output, wherein the input of every evaluating circuit is connected with the input signal, wherein an evaluating circuit is in each case read into the shift register as a result of the closure of a switching element, and wherein the filtered signal is withdrawn from the series output, characterized in that each evaluating circuit is read-in several times between two consecutive charge shift processes to effect a multiple read-in process, where a charge shift process is in each case carried out between two such multiple read-in processes, and wherein no charge shift process is carried out during each multiple read-in process.

2. A process for the operation of a transversal filter according to claim 1, characterized in that the signal to be filtered is consecutively scanned, each of the scanned values being held during several read-in processes of the evaluating circuits for reading in of each scanned value several times consecutively and thereby to effect successive read-in processes of the same scanned value, where as charge shift process is in each case carried out between successive read-in processes of the same scanned value, and wherein no charge shift process is carried out between the last read-in process of one scanned value and the first read-in process for the next scanned value to provide a multiple read-in process.

3. A process for the operation of a transversal filter according to claim 2, characterized in that for each of the scanned values each evaluating circuit is read-in two times consecutively, where a charge shift process is in each case carried out between the two such read-in processes for the same scanned value, and wherein no charge shift process is carried out between the second read-in process of one scanned value and the first read-in process for the next scanned value.

4. A process for the operation of a transversal filter according to claim 1 wherein the signal to be filtered has a negligible change in value between the first and last read-in processes of each multiple read-in process and is supplied directly to the input of every evaluating circuit for read-in several times between any two consecutive charge shift processes.

* * * * *